United States Patent [19]

Moog et al.

[11] 4,166,197
[45] Aug. 28, 1979

[54] PARAMETRIC ADJUSTMENT CIRCUIT

[75] Inventors: Robert A. Moog, East Aurora; Richard M. Walborn, Tonwanda, both of N.Y.

[73] Assignee: Norlin Music, Inc., Lincolnwood, Ill.

[21] Appl. No.: 891,694

[22] Filed: Mar. 30, 1978

[51] Int. Cl.$^2$ ............................................. H03H 7/16
[52] U.S. Cl. .................................................. 179/1 D
[58] Field of Search ................ 179/1 D, 1 AT, 1 M, 179/1 FS; 84/1.11; 330/2; 333/18, 28 T

[56] References Cited

U.S. PATENT DOCUMENTS

| | | | |
|---|---|---|---|
| 4,046,960 | 9/1977 | Veale | 179/1 D |
| 4,088,834 | 5/1978 | Thurmond | 179/1 AT |

Primary Examiner—Kathleen H. Claffy
Assistant Examiner—E. S. Kemeny
Attorney, Agent, or Firm—Allegretti, Newitt, Witcoff & McAndrews

[57] ABSTRACT

An improved frequency sensitive circuit capable of adjusting one or more of its parameters in order to shunt an adjustable amount of electrical signal to a current sink, thereby controlling the amplitude of the signal. The frequency sensitive circuit is connected to the wiper of a potentiometer that is placed across the inputs of a difference amplifier in order to control the peak value of the cut or boost in the signal. The frequency sensitive circuit includes a shunt impedance connected between the wiper of the potentiometer and the current sink. A resonant circuit is connected to the impedance and is tuned to an adjustable resonant frequency. A compensation circuit, such as a difference amplifier referenced to the wiper, couples the output of the resonant circuit to the shunt impedance so that the impedance of the frequency sensitive circuit approaches infinity as the frequency of the electrical signal is displaced from the resonant frequency. As a result, the frequency sensitive circuit has substantially no effect on the overall amplitude of the electrical signal at frequencies widely displaced from the resonant frequency.

9 Claims, 6 Drawing Figures 4,166,197

PARAMETRIC ADJUSTMENT CIRCUIT

BACKGROUND AND SUMMARY OF THE INVENTION

This invention relates to resonant audio circuits and more specifically relates to parametric equalizers used in audio circuits.

Parametric circuits capable of adjusting one or more parameters have found increasing acceptance in audio devices. Such circuits can be used to equalize room accoustics, compensate for a deficiency in an overall audio system, change the quality of sound of a specialized or non-linear amplifier, such as a guitar amplifier, or give a different character or timbre to a signal generated by an electronic musical instrument, such as a synthesizer or electronic organ.

Parametric circuits generally try to achieve these results by changing one or more parameters in order to control an input audio electrical signal. Such circuits generally have a response characterized by the parameters of height, center frequency and width. Parametric equalizers are capable of adjusting all three of these parameters, whereas graphic equalizers generally adjust only the height parameter. These parameters are more completely defined in a paper by one of the coinventors, Robert A. Moog, entitled "Graphic and Parametric Equalizers" published in November, 1977 issue of *Contemporary Keyboard* Magazine, and incorporated by reference.

By controlling the foregoing parameters, audio electrical signals can be altered in order to provide a variety of musical effects. For example, particular ranges of frequencies can be emphasized or de-emphasized in order to provide additional color to the timbre of the resulting sounds.

Although parametric circuits have been devised in the past, each has exhibited deficiencies making it unsuitable for use in audio circuits, especially audio circuits intended for electronic musical instruments. For example, such circuits have been excessively noisy, even when the height parameter is neutral (neither boosted nor cut). In addition, some of the more inexpensive circuits have a residual gain when an input audio signal is widely displaced from the resonant frequency of the circuit. As a result of this characteristic, both the parametric controls and the overall volume or amplitude control of the circuit must be simultaneously adjusted in order to control the amplitude of the resulting electrical signal. The use of such a circuit in an electronic musical instrument compromises the performer's ability to control the resulting sound. In addition, prior circuits have been arranged so that manipulation of the width control also affects the height parameter. This characteristic is also undesirable for applications in electronic musical instruments.

Circuits overcoming some of the foregoing deficiencies are known in the art in the form of graphic equalizers. Although these circuits overcome some of the foregoing deficiencies, they are excessively expensive to manufacture. One such circuit utilizes a difference amplifier having a series of potentiometers connected in parallel across its inputs. The wipers of the potentiometers are connected to antiresonant circuits having particular frequencies, generally spaced an octave apart. In order to cover the entire audio sound spectrum, a large number of such circuits must be utilized.

The applicants have overcome the deficiencies of the prior art by devising an improved frequency sensitive circuit for use in connection with the difference amplifiers previously used in graphic equalizer circuits. By employing this improved circuit, the resonant frequency can be adjusted over a substantial portion of the audio range and the height and width parameters can also be controlled with a minimum of circuitry and expense. In addition, all of the above noted deficiencies of the prior art circuits can be overcome.

DESCRIPTION OF THE DRAWINGS

These and other advantages and features of the present invention will hereafter appear in connection with the accompanying drawings wherein like numbers refer to like parts throughout and wherein.

DESCRIPTION OF THE PREFERRED EMBODIMENT

Figure 1:
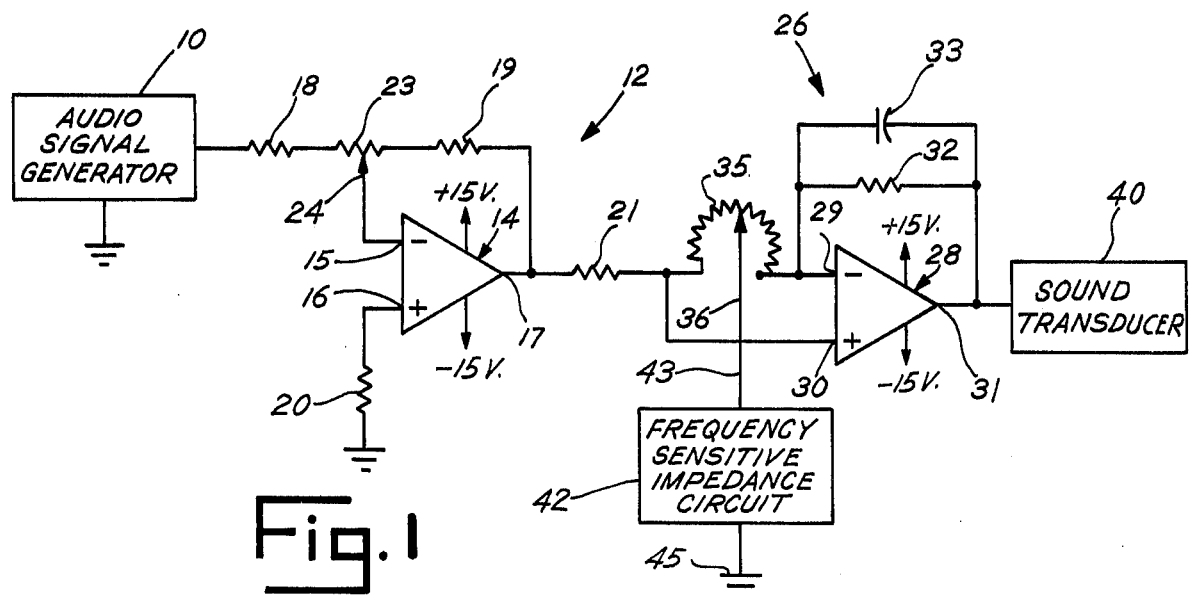
FIG. 1 is an electrical schematic drawing of a preferred form of parametric control circuit made in accordance with the present invention.

Referring to FIG. 1, a preferred form of the present invention basically comprises an audio signal generator 10, a buffer amplifier stage 12, a differential amplifier stage 26, a sound transducer stage 40 and a frequency sensitive impedance circuit 42.

Generator 10 may be a conventional sine-wave type generator capable of generating signals over the audio spectrum of frequencies from about 20-20,000 Hertz. The generator also may be a musical source of electrical signals, such as a guitar pickup or an electronic organ tone generator.

Buffer amplifier stage 12 comprises an operational amplifier 14 including an inverting input 15, a non-inverting input 16 and an output 17. The stage also includes a feedback resistor 32 and a feedback capacitor 33, as well as potentiometer 35 having an adjustable wiper 36.

Sound transducer stage 40 is well known in the art and can include a conventional audio amplifier and loud speaker transducer (not shown). The foregoing components are known in the art and can be found in at least one graphic equalizer device. However, the applicant has improved on the prior art by adding a frequency sensitive impedance circuit 42, which is connected to wiper 36 by a conductor 43. Circuit 42 exhibits a minimum impedance at a predetermined resonant frequency which can be adjusted. If wiper 36 is moved into contact with input 30, a substantial portion of the input signal received through resistor 21 is shunted to a current sink 45 (represented by ground potential). In this mode of operation, the input signal is substantially attenuated at the resonant frequency. If wiper 36 is moved into contact with input 29, the feedback received through resistor 32 and capacitor 33 is substantially attenuated at the resonant frequency, thereby increasing the gain of amplifier 28 and boosting or peaking the input signal at the resonant frequency. Thus, by moving wiper 36, the amount of boost or cut of the input electrical signal can be easily adjusted.

Figure 2:
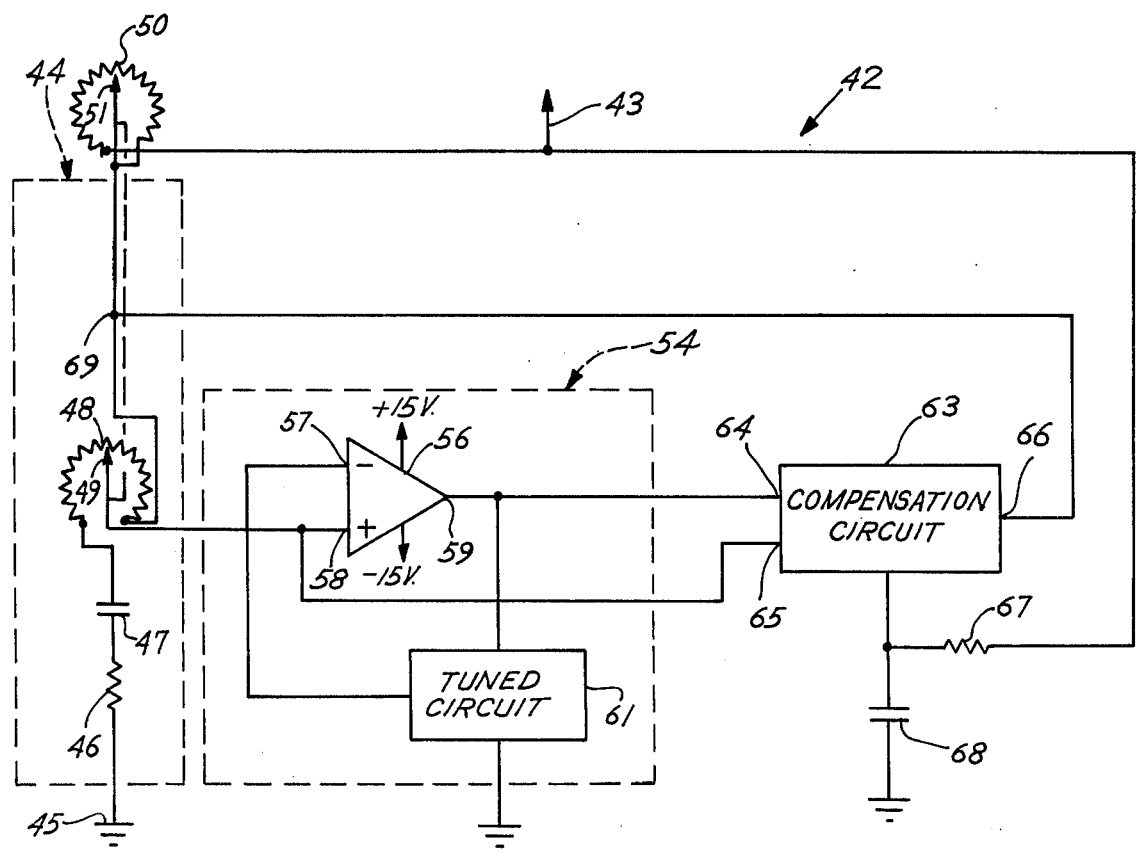
FIG. 2 is a block diagram of the frequency sensitive impedance circuit shown in FIG. 1.

The applicants' unique frequency sensitive impedance circuit 42 is shown in more detail in FIG. 2. The circuit basically comprises a shunt impedance 44, a resonant circuit 54, and a compensation circuit 63.

Shunt impedance 44 is connected between wiper 36 and current sink 45, and comprises a resistor 46, a capacitor 47, a potentiometer 48 with an adjustable wiper 49 and a potentiometer 50 with an adjustable wiper 51. Wipers 49 and 51 mechanically are ganged together as indicated by the dotted line joining them. Wiper 49 controls the width parameter of the frequency response of circuit 42 in a manner described hereafter.

Resonant circuit 54 comprises an operational amplifier 56 including an inverting input 57, a non-inverting input 58 and an output 59. The resonant circuit also includes a tuned circuit 61 which is connected directly from output 59 to inverting input 57. This is an important feature which substantially reduces the noise inherent in prior art circuits which attenuate the signal transmitted from the output of a tuned circuit to the input of an operational amplifier.

Compensation circuit 63 includes inputs 64 and 65, and an output 66. The circuit is further controlled by a resistor 67 and a capacitor 68. Resistor 67 is an important feature which references the circuit to wiper 36. With this unique referencing, the compensation circuit is able to couple the impedance from resonant circuit 54 to a point 69 of the shunt impedance circuit in order to control the response of circuit 42. In addition, compensation circuit 63 causes the voltage on point 69 to approach the voltage on wiper 36 as the frequency of the input electrical signal is displaced from the resonant frequency of circuit 61. This is an important feature which enables circuit 42 to have substantially no effect on the audio input signal at frequencies widely displaced from the resonant frequency. At such frequencies, operation of the parameter controls of circuit 42 has no effect on the overall volume or amplitude of sound produced by transducer 40.

Figure 3:
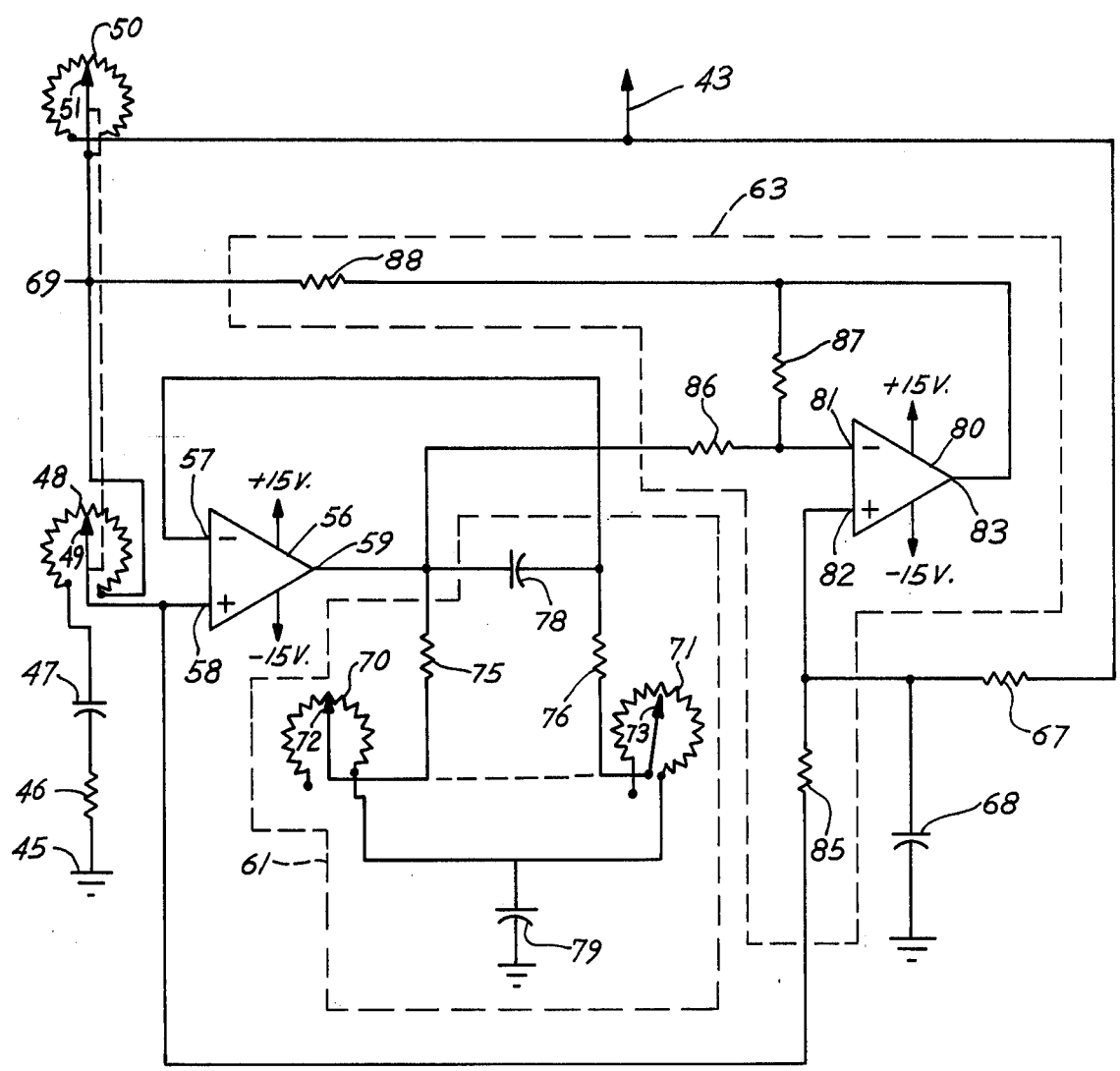
FIG. 3 is a detailed schematic diagram of the frequency sensitive impedance circuit shown in FIG. 1.

Referring to FIG. 3, tuned circuit 61 and compensation circuit 63 are shown in more detail:

Circuit 61 includes potentiometers 70, 71 which are controlled by ganged wipers 72, 73. The circuit also includes resistors 75, 76 as well as capacitors 78, 79. Wipers 72, 73 control the resonant frequency of circuit 61.

Compensation circuit 63 includes an operational amplifier 80 having an inverting input 81, a non-inverting input 82 and an output 83. The circuit also includes resistors 85-88 which cause amplifier 80 to operate as a difference amplifier.

For the preferred embodiment, all of the operational amplifiers are type 4558 manufactured by Texas Instruments, Inc. In additon, all of the operational amplifiers are operated from a plub 15 volt and a minus 15 volt source as shown in the drawings.

The resistors and capacitors of the preferred embodiment have values shown in the following table:

| Component | Value |
| --- | --- |
| 18 | 4.7k |
| 19 | 4.7k |
| 20 | 47.0k |
| 21 | 3.0k |
| 23 | 10.0k |
| 32 | 3.0k |
| 35 | 25.0k |
| 46 | 2.2k |
| 48 | 50.0k |
| 50 | 0.5k |
| 67 | 15.0k |
| 70 | 100.0k |
| 71 | 100.0k |
| 75 | 0.68k |
| 76 | 0.68k |
| 85 | 22.0k |
| 86 | 22.0k |
| 87 | 22.0k |
| 33 | 500pf |
| 47 | 10µf |
| 68 | 100pf |
| 78 | 2700pf |
| 79 | 1µf |

Figure 4:
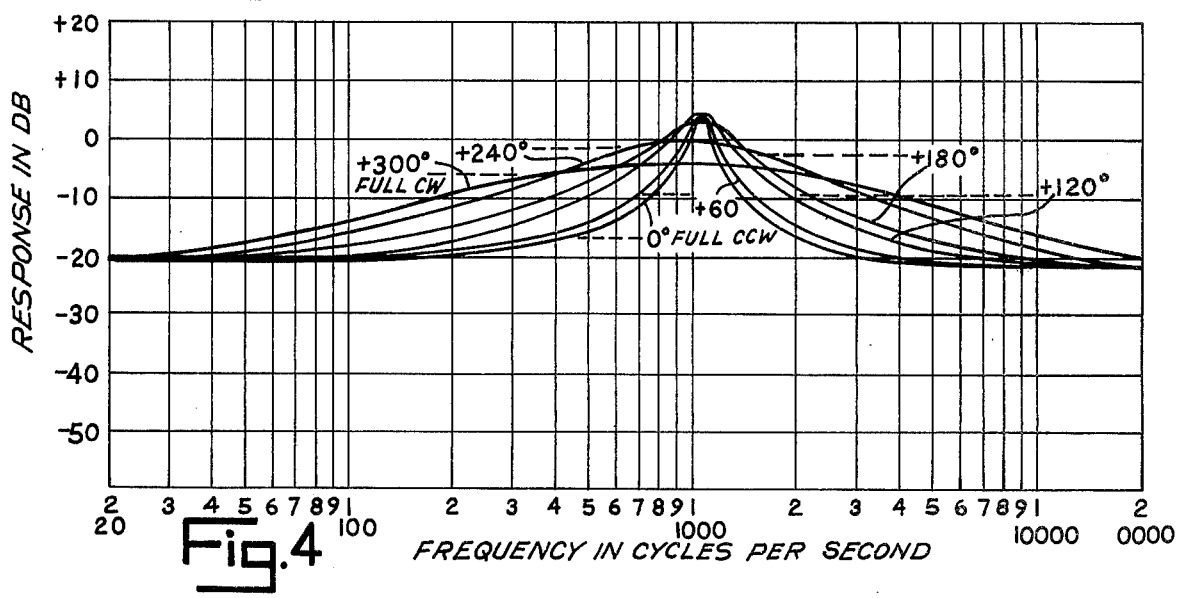
FIG. 4 is a graph illustrating the frequency response of the circuit shown in FIG. 1 when the width control is adjusted and the frequency and height controls are held constant.

FIG. 4 illustrates the frequency response of the apparatus when wipers 36, 72 and 73 are held constant and wiper 49 is varied to the positions shown. Wiper 36 is held in the full clockwise position and wipers 72, 73 are held in the positions which will produce a peak response at 1k Hz. The various positions of wiper 49 are indicated in degrees of clockwise rotation where 360° represents one complete revolution. It should be noticed that the absolute peak of the response (i.e., the value of the height parameter) decreases somewhat as the width of the resonant frequency range is widened. This is an important feature which is created by potentiometer 50. If a short circuit were substituted for potentiometer 50, the absolute peak of the response (and the value of the height parameter) would increase as the width of the frequency range increases. This is due to the increase in negative feedback coupled to input 58 as wiper 49 is turned clockwise. For some applications, such as an electronic musical instrument, the increase of the height parameter is an undesirable result which is overcome by the placement of potentiometer 50 in the circuit. By properly ganging wipers 49 and 51 together, the absolute peak of the frequency response can be held substantially constant or reduced somewhat as the width is increased. This provides a more pleasing musical effect and is another important feature achieved by the present invention.

Figure 5:
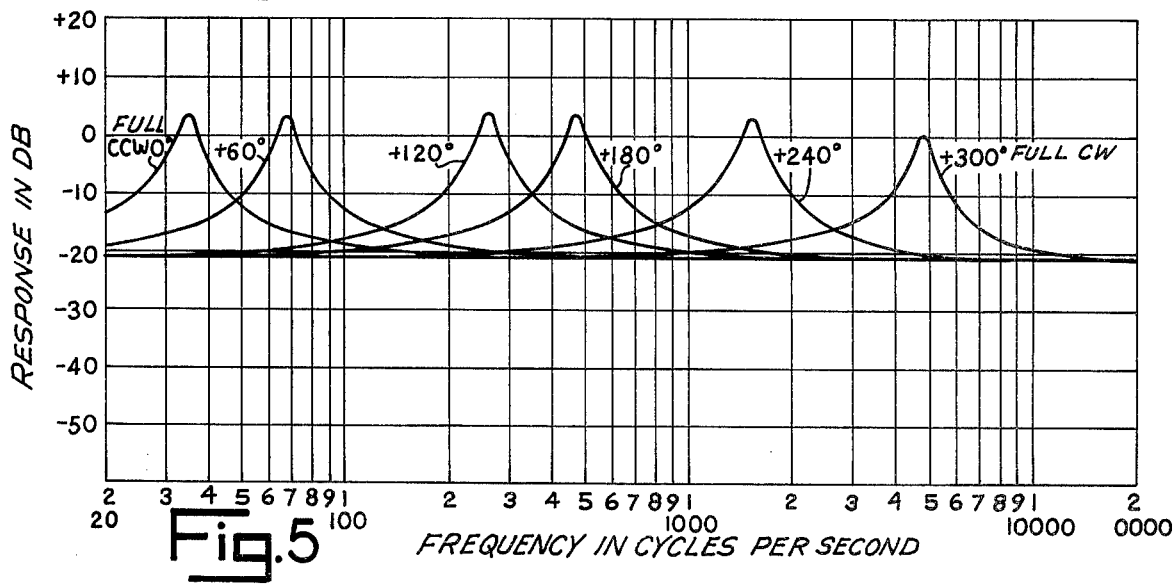
FIG. 5 is a graph illustrating the frequency response of the apparatus shown in FIG. 1 when the frequency control is adjusted and the width and height controls are held constant.

FIG. 5 illustrates the frequency response of the overall apparatus when potentiometer 36 is held in the full clockwise position as in the case of FIG. 4, and wiper 49 is moved to the full counterclockwise position. Wipers 72 and 73 are then rotated to the positions shown in FIG. 5. Rotation of wipers 72 and 73 change the time constant or antiresonant frequency of circuit 61, thereby altering the frequency response parameter of the overall system.

Figure 6:
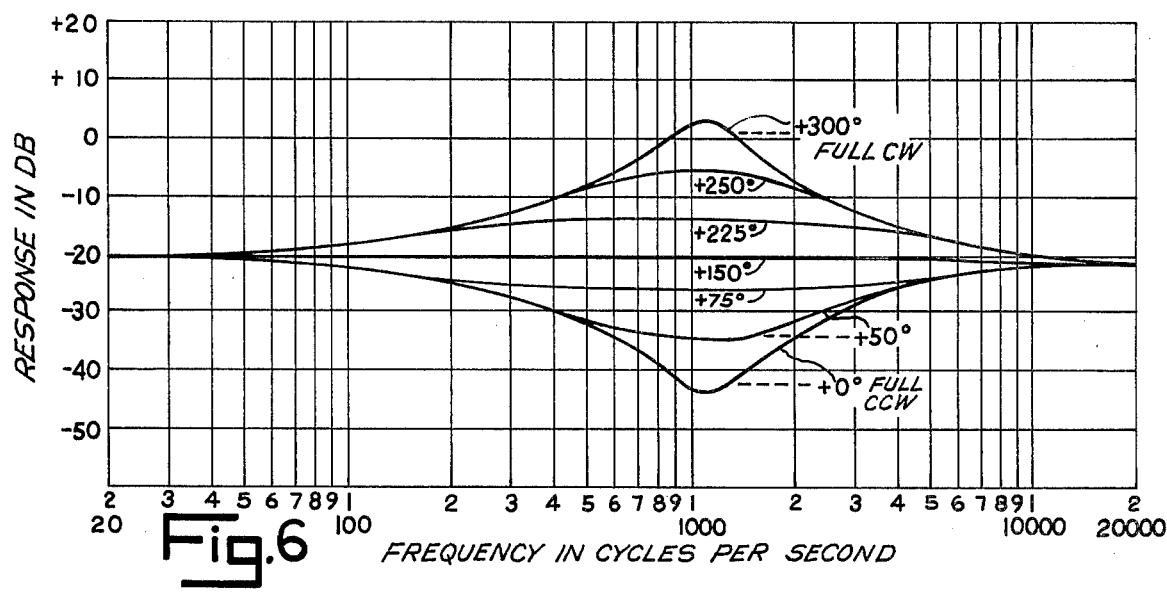
FIG. 6 is a graph illustrating the frequency response of the apparatus shown in FIG. 1 when the height control is adjusted while the width and frequency controls are held constant.

FIG. 6 illustrates the frequency response of the apparatus when wiper 49 is held in the full counterclockwise position, wipers 72 and 73 are held at the positions which will produce a peak response at approximately 1k Hz. and wiper 36 is rotated to the positions shown in the drawing. The reason for cut and boost in the height parameter as wiper 36 is rotated has been previously described.

As shown in FIGS. 4–6, the use of the described circuitry enables the frequency, height and width response parameters to be carefully controlled in an economical and accurate manner. In particular, the absence of a "pedestal" encountered with some prior art equalizer circuits should be noted. It is believed that the absence of a pedestal is primarily due to the unique operation of compensation circuit 63. As the frequency of the input signal is displaced from the resonant frequency of circuit 61, signals of like amplitude are received by inputs 81 and 82 of operational amplifier 80. Under these conditions, the voltage on output 80 approaches the voltage to which input 82 is referenced, i.e., the voltage on wiper 36. As a result, no current can flow through conductor 43 to point 69, and circuit 42 therefore appears as an infinite impedance to the input signal. Since virtually no current is conducted through conductor 43, the input signal is transmitted to the input of operational amplifier 28 with no pedestal.

Those skilled in the art will appreciate that only a single preferred embodiment of the present invention has been described and that modifications can be made in the embodiment without departing from the true spirit and scope of the invention as defined in the appended claims. For example, tuned circuit 61 could be designed to achieve a maximum impedance at the resonant frequency, rather than a minimum impedance. Switched resistors could be substituted for the potentiometers shown in the drawings.

What is claimed is:

1. In an audio system for amplifying an electrical signal including first difference amplifier means having a first input and a second input and further including variable resistance means connected across the first and second inputs for controlling the height parameter of the system, improved apparatus coupled to the variable resistance means for adjusting the width and frequency response parameters of the system in order to shunt an adjustable amount of the electrical signal to a current sink, said apparatus comprising:
   shunt means for conducting variable amounts of the electrical signal between the variable resistance means and the current sink depending on the value of a compensation signal;
   resonant means including an input and an output for creating an impedance maximum or minimum at an adjustable resonant frequency;
   means for adjusting the resonant frequency whereby the frequency parameter can be controlled;
   means for adjustably coupling the shunt means to the resonant means, whereby the width parameter can be adjusted; and
   compensation means responsive to the resonant means for generating the compensation signal and for applying the compensation signal to the shunt means, whereby conduction of the electrical signal through the shunt means is inhibited at frequencies widely displaced from the resonant frequency.

2. Apparatus, as claimed in claim 1, wherein the compensation means comprises means for causing a voltage on at least a portion of the shunt means to approach the voltage of a portion of the variable resistance means as the frequency of the electrical signal is displaced from the resonant frequency.

3. Apparatus, as claimed in claim 2, wherein the variable resistance means comprises a first potentiometer and wherein said portion of the variable resistance means comprises a first wiper of the first potentiometer.

4. Apparatus, as claimed in claim 3, wherein the shunt means comprises a second potentiometer including a second wiper and a third potentiometer including a third wiper.

5. Apparatus, as claimed in claim 4, wherein the means for adjustably coupling comprises the second wiper, whereby the width parameter can be adjusted.

6. Apparatus, as claimed in claim 5, wherein the third potentiometer is connected between the first wiper and the second potentiometer, wherein the compensation means includes an output operatively connected between the second and third potentiometers, whereby the value of the height parameter can be maintained relatively constant as the second wiper is adjusted.

7. Apparatus, as claimed in claim 1, wherein the resonant means comprises:
   a first operational amplifier including an inverting input operatively connected to the means for adjustably coupling, a non-inverting input, and an output; and
   a tuned circuit connected between the non-inverting input and the output of the first operational amplifier.

8. Apparatus, as claimed in claim 7, wherein the compensation means comprises a second differential amplifier including a third input coupled to the output of the first operational amplifier, a fourth input coupled to the non-inverting input of the first operational amplifier and an output coupled to said shunt means.

9. Apparatus, as claimed in claim 8, and further comprising a resistor operatively coupling the fourth input to said portion of the variable resistance means, whereby the second differential amplifier is referenced to the voltage of said portion.

* * * * *